United States Patent [19]

Espinosa

[11] 4,059,537

[45] Nov. 22, 1977

[54] PIEZOELECTRIC MATERIAL

[75] Inventor: Gerald P. Espinosa, Thousand Oaks, Calif.

[73] Assignee: Rockwell International Corporation, El Segundo, Calif.

[21] Appl. No.: 731,160

[22] Filed: Oct. 12, 1976

[51] Int. Cl.$^2$ .................. C04B 35/46; C04B 35/48
[52] U.S. Cl. .................................................. 252/62.9
[58] Field of Search ........................................ 252/62.9

[56] References Cited

U.S. PATENT DOCUMENTS

| 3,464,924 | 9/1969 | Banno et al. ................. 252/62.9 |
| 3,533,951 | 10/1970 | Tsubouchi et al. ............. 252/62.9 |

FOREIGN PATENT DOCUMENTS

| 46-19658 | 6/1971 | Japan ............................... 252/62.9 |
| 47-48716 | 12/1972 | Japan ............................... 252/62.9 |
| 46-19654 | 6/1971 | Japan ............................... 252/62.9 |
| 1,401,389 | 7/1975 | United Kingdom ............... 252/62.9 |
| 286,012 | 1/1971 | U.S.S.R. ........................... 252/62.9 |

Primary Examiner—Jack Cooper
Attorney, Agent, or Firm—L. Lee Humphries; Craig O. Malin

[57] ABSTRACT

A piezoelectric material and a method of producing a piezoelectric material which has a low temperature coefficient of resonant frequency, a low hysteresis, a high mechanical Q, and is suitable for fabricating into mechanical filters. The material is a compound of the general formula $Pb(Zr,Ti)O_3$ containing Bi substituting for 2 to 15 atomic percent of the Pb and further containing Mn, Zn, and Ni substituting for up to 4 atomic percent of the Zr and Ti.

1 Claim, No Drawings

PIEZOELECTRIC MATERIAL

BACKGROUND OF THE INVENTION

A. Field of the Invention

This invention relates to the field of piezoelectric materials and particularly to materials based on the general compound $Pb(Zr,Ti)O_3$.

B. Description of the Prior Art

The electromechanical properties of piezoelectric materials make them suitable for use in high-frequency (over 20 $MH_z$), acoustic surface wave devices for filters (SAW filters), discriminators, and other devices. However, prior piezoelectric materials do not have the combination of properties required to provide a stable surface wave velocity with temperature and time, while still providing good piezoelectric efficiency. The prior materials have either low coupling, high temperature coefficient of resonant frequency, high hysteresis, low mechanical Q, or poor fabricability. Such lack of optimum properties severely limits the application of acoustic surface wave devices.

SUMMARY OF THE INVENTION

It is an object of the invention to provide an improved piezoelectric material.

It is an object of the invention to provide a piezoelectric material having a low temperature coefficient of resonant frequency.

It is an object of the invention to provide a piezoelectric material having low hysteresis.

It is an object of the invention to provide a piezoelectric material having high mechanical Q.

It is an object of the invention to provide a piezoelectric material having improved fabricability.

It is an object of the invention to provide an improved piezoelectric material for use in high frequency, acoustic surface wave devices.

It is an object of the invention to provide a piezoelectric material having a combination of properties which are optimized for use in acoustic surface wave devices, namely, a high mechanical Q, a high coupling coefficient, a low temperature coefficiency of resonant frequency, and a low hysteresis.

According to the invention, a piezoelectric material is provided which has an improved combination of properties required for high-frequency acoustic surface wave devices. The material is a compound of the general formula $Pb(Zr,Ti)O_3$ containing Bi substituting for 2 to 15 atomic percent of the Pb and further containing Mn, Zn, and Ni substituting for up to 4 atomic percent of the Zr and Ti.

These and other objects and features of the present invention will be apparent from the following detailed description.

DESCRIPTION OF THE PREFERRED EMBODIMENT

The piezoelectric materials of the invention are based upon the compound $Pb(Zr,Ti)O_3$ with selected elements substitutionally replacing part of the Pb, Zr, and Ti in the compound. The invention encompasses formulations in which 2 to 15 atomic percent of the Pb is substituted by Bi, and up to 4 atomic percent of the Zr and Ti are substituted by from 1 to 4 atomic percent Mn and up to 3 atomic percent of Zn and Ni. The composition of the material falls substantially within the range defined by the following chemical formula:

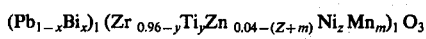

$$(Pb_{1-x}Bi_x)_1 (Zr_{0.96-y}Ti_yZn_{0.04-(z+m)}Ni_zMn_m)_1 O_3$$

where:
- $x = 0.02$ to $0.15$
- $y = 0.44$ to $0.56$
- $m = 0.01$ to $0.04$ and
- $z = 0.03$ max.

In a preferred embodiment of the invention, oxides of the elements making up the compound are mixed to give the desired formulation within the range discussed above. In the context of this invention, the term oxides includes other oxygen-containing compounds such as carbonates in which the not needed constituents are driven off during processing. The intimately mixed components are then calcined in an oxygen atmosphere. The cake from the calcining operation is ground and compacted into a pellet. The pellet is fired at a high temperature in an oxygen atmosphere. The resulting forroelectric material is then poled. This is a known process called "poling". During poling, the electric domains in the material are orientated predominately in one direction by exposing the material to a high voltage for a short time at a slightly elevated temperature.

Specific examples of compounds made according to the invention are as follows:

EXAMPLE I

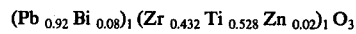

$$(Pb_{0.92} Bi_{0.08})_1 (Zr_{0.432} Ti_{0.528} Zn_{0.02})_1 O_3$$

Oxides of the elements shown in the formula above are weighed out according to their mole contribution to the formula. An example of the quantities of oxides required to make an 0.03 mole sample of the formula of Example I is shown in Table I below.

TABLE I

| Compound | Molecular Weight | No. of Moles of compound in Formulation | Mole Contribution | gms in .03 Mole of Formula |
|---|---|---|---|---|
| PbO | 223.21 | 0.92 | 205.35 | 6.1606 |
| $Bi_2O_3$ | 466.00 | 0.04 | 18.64 | 0.5592 |
| $ZrO_2$ | 123.91 | 0.432 | 53.53 | 1.6059 |
| $TiO_2$ | 80.03 | 0.528 | 42.26 | 1.2720 |
| ZnO | 81.38 | 0.02 | 1.63 | 0.0488 |
| $MnCO_3$ | 122.90 | 0.02 | 2.46 | 0.0737 |

A 2.2 weight percent of PbO in excess of the quantities shown in Table I is added to provide a solvent and to compensate for volatilization during preparation. The components are then thoroughly mixed in an agate mortar or other suitable mixer, such as a rocking blender.

The intimately mixed components are then packed into a platinum container and calcined at 825° C in an oxygen atmosphere for 20 hours. This is the initial step for reacting the components to form a cake for further processing.

The calcined cake is next crushed and ground in an agate mortar. The ground material is loaded into a 4 ounce Nalgine jar together with zirconia grinding rods (charging factor of 0.93 gm/cc) and acetone. The jar, plus contents, is then milled on a jar mill at 160 rpm for 3 hours.

The milled calcined material is washed out of the jar with methanol through a 60-mesh sieve, air dried, and furnace-dried at 500° C. The dried material is formed into a pellet by compressing it at 400 kg/cm² in a stainless steel die. The green pellet is transferred to a platinum boat with lid for firing.

The platinum boat containing the pellet is transferred to a furnace having an atmosphere of flowing oxygen and operating at about 600° C for final firing. The furnace temperature is raised gradually during 1½ hours to a temperature of 1130° C, held at 1130° C for 1½ hours, furnace-cooled to 400° C, and finally held at 400° C for several hours before removing from the furnace. The sintered pellet measures approximately 1.6 cm in diameter by 0.6 cm thick.

The pellet is then inspected, its capacitance checked, if desired, and finally poled to develop optimum piezoelectric properties. Poling is accomplished in a silicon oil at 25 KV/cm for 20 minutes at 120° C.

The material produced according to Example I has good stability and acceptable efficiency. Its temperature coefficient of resonant frequency (a measure of the change in frequency with the change in temperature) is:

40 ppm/° C at temperatures between −60° C to 30° C
15 ppm/° C at temperatures between 30° C to 60° C
0 ppm/° C at 70° C An additional measure of the stability of a piezoelectric material is its hysteresis, which is the drift of its resonant frequency at a given temperature after being cycled away from and back to that temperature. For the embodiment of Example I, the hysteresis is less than 250 ppm. For prior art materials, the hysteresis is typically greater than 250 ppm.

The efficiency of a piezoelectric material is defined by its mechanical Q which is a measure of the efficiency of storage of mechanical energy within the material, and its coupling coefficient, which is a measure of the efficiency of transfer of electrical energy to mechanical energy. For the composition of Example I, the mechanical Q is 2000 and the coupling coefficient ($k_{31}$) is 0.21. Its dielectric constant is 885.

EXAMPLE II $(Pb_{0.94} Bi_{0.06})_1 (Zr_{0.432} Ti_{0.528} Ni_{0.02} Mn_{0.02})_1 O_3$

Oxides of the elements shown in the formula above are weighed out according to their mole contribution to the formula, as explained for Example I. The steps of mixing, calcining, milling, and poling, as previously described for Example I, are carried out on the oxides selected according to the formula for Example II. The properties of the resulting material are as follows:

| Temperature coefficient of resonant frequency: | |
|---|---|
| 22 ppm/° C at temperature between −60° C to 100° C | |
| Hysteresis | : Less than 250 ppm |
| Mechanical Q | : 1150 |
| Coupling coefficient ($k_{31}$) | : 0.18 |

-continued

| Temperature coefficient of resonant frequency: | |
|---|---|
| 22 ppm/° C at temperature between −60° C to 100° C | |
| Dielectric constant | : 670 |

EXAMPLE III $(Pb_{0.92} Bi_{0.08})_1 (Zr_{0.46} Ti_{0.50} Zn_{0.02} Mn_{0.02})_1 O_3$

Material was prepared according to the above formula, utilizing the process steps as described for Example I. The properties of the resulting material are as follows:

| Temperature coefficient of resonant frequency: | |
|---|---|
| 25 ppm/° C at temperatures between 0° C to 100° C | |
| Hysteresis | : Less than 250 ppm |
| Mechanical Q | : 1500 |
| Coupling coefficient ($k_{31}$) | : 0.23 |

EXAMPLE IV $(Pb_{0.92} Bi_{0.08})_1 (Zr_{0.49} Ti_{0.47} Zn_{0.02} Mn_{0.02})_1 O_3$

Material was prepared according to the above formula, utilizing the process steps as described for Example I. The properties of the resulting material are as follows:

| Temperature coefficient of resonant frequency: | |
|---|---|
| 350 ppm/° C at temperatures between 24° C to 287° C, | |
| 225 ppm/° C at temperatures between −35° C to 224° C | |
| Hysteresis | : Less than 250 ppm |
| Mechanical Q | : 1450 |
| Coupling coefficient ($k_{31}$) | : 0.25 |

While piezoelectric materials are known which have efficiencies equal to the values obtained by the materials according to Examples I–IV, such known materials do not have such high efficiencies in combination with the good stability and low hysteresis (less than 250 ppm) of the materials according to this invention.

Numerous variations and modifications may be made without departing from the present invention. Accordingly, it should be clearly understood that the form of the present invention described above is illustrative only and is not intended to limit the scope of the present invention.

What is claimed is:

1. A piezoelectric material having the following approximate formula:

$(Pb_{0.94} Bi_{0.06})_1 (Zr_{0.432} Ti_{0.528} Ni_{0.02} Mn_{0.02})_1 O_3$, and wherein the hysteresis of said material is less than 250 ppm and the temperature coefficient of resonant frequency between −60° C to 100° C is approximately 22 ppm per ° C.

* * * * *